(12) United States Patent
Myoung et al.

(10) Patent No.: US 7,453,045 B2
(45) Date of Patent: Nov. 18, 2008

(54) RIGID-FLEXIBLE PCB HAVING COVERLAY MADE OF LIQUID CRYSTALLINE POLYMER AND FABRICATION METHOD THEREOF

(75) Inventors: Bum-Young Myoung, Seoul (KR); Dek-Gin Yang, Chungcheongbuk-do (KR); Dong-Kuk Kim, Kyunggi-do (KR)

(73) Assignee: Samsung Electro-Mechanics Co. Ltd, Kyunggi-Do (KR)

( * ) Notice: Subject to any disclaimer, the term of this patent is extended or adjusted under 35 U.S.C. 154(b) by 0 days.

(21) Appl. No.: 11/440,806

(22) Filed: May 25, 2006

(65) Prior Publication Data

US 2006/0213683 A1 Sep. 28, 2006

Related U.S. Application Data

(62) Division of application No. 10/969,407, filed on Oct. 20, 2004, now Pat. No. 7,082,679.

(30) Foreign Application Priority Data

Jul. 26, 2004 (KR) ............................... 2004-58315

(51) Int. Cl.
*H05K 1/00* (2006.01)
(52) U.S. Cl. ...................................... 174/254; 361/748

(58) Field of Classification Search .................. 174/254, 174/259; 361/749–751
See application file for complete search history.

(56) References Cited

U.S. PATENT DOCUMENTS

| 6,440,542 | B1* | 8/2002 | Kariya .................... 428/209 |
| 7,348,492 | B1* | 3/2008 | Kawai et al. .............. 174/254 |
| 2003/0177635 | A1* | 9/2003 | Arrington et al. .......... 29/830 |
| 2004/0118596 | A1* | 6/2004 | Fuller et al. ............. 174/255 |

FOREIGN PATENT DOCUMENTS

| JP | 2-92976 | 7/1990 |
| JP | 04-026190 | 1/1992 |
| JP | 2000-183506 | 6/2000 |
| JP | 2002-280733 | 9/2002 |
| JP | 2003-264369 | 9/2003 |

* cited by examiner

*Primary Examiner*—Jeremy C Norris
(74) *Attorney, Agent, or Firm*—Gottlieb Rackman & Reisman, P.C.

(57) ABSTRACT

Disclosed are a rigid-flexible PCB and a method for fabricating the rigid-flexible PCB. Characterized by using a liquid crystalline polymer for the formation of coverlay over flexible regions, the all-layer processing method has the advantage of preventing interlayer delamination, thereby providing a highly reliable rigid-flexible PCB which thus meets the recent requirements of electric appliances for low energy consumption, high frequency adoption, and slimness.

6 Claims, 8 Drawing Sheets

RIGID-FLEXIBLE PCB HAVING COVERLAY MADE OF LIQUID CRYSTALLINE POLYMER AND FABRICATION METHOD THEREOF

This application is a Division of U.S. Ser. No. 10/969,407 filed Oct. 20, 2004, now U.S. Pat. No. 7,082,679, the content of which is incorporated herein by reference.

BACKGROUND OF THE INVENTION

1. Field of the Invention

The present invention relates to a rigid-flexible printed circuit board (PCB) which employs a liquid crystalline polymer. More particularly, the present invention relates to a rigid-flexible PCB in which a coverlay is formed of a liquid crystalline polymer over a flexible region by an all layer processing process. Also, the present invention is concerned with a method for fabricating such a rigid-flexible PCB.

2. Description of the Prior Art

With today's ever smaller and slimmer packaging requirements, various multilayer printed circuit boards have recently been developed which can have integrated electronic devices mounted on their surfaces. Particularly, rigid-flexible PCBs are under intensive study because they have the advantage of space economy and spatial variability.

Extensively used in personal computers, PDAs and mobile phones, rigid-flexible PCBs usually comprise rigid regions which are supported by prepreg to impart mechanical strength to the PCBs, and flexible regions which connect the rigid regions to each other.

In rigid flexible circuit boards are found coverlay films which are responsible for the protection of the circuit patterns formed in the flexible regions and are usually made of polyimide.

In order to better understand the background of the invention, a description will be given of conventional rigid-flexible PCBs and their fabrication with reference to FIGS. 1 to 3, below.

FIG. 1 describes a partial coating method for forming a coverlay film on a predetermined portion of a flexible region in a rigid-flexible PCB.

First, while being masked, a copper foil layer 12 which, together with a polyimide layer 11, constitutes a polyimide copper foil laminate 10, is patterned to form a predetermined inner circuit pattern (not shown) thereon.

In order to protect the inner circuit pattern, then, a polyimide film 20 is provided as being larger in size than a flexible region within which the circuit pattern is confined.

The polyimide film 20 is placed on the flexible region of the copper foil layer 12 interleaved with an adhesive 21, followed by pseudo-bonding the polyimide film 20 to the flexible region manually with the aid of a soldering iron.

After the bonding of the polyimide film 20 to the flexible region, a prepreg 30 is provided to give mechanical strength and bonding power to the polyimide copper foil laminate 10, as shown in FIG. 1.

Afterwards, another copper foil laminate 10' in which a polyimide layer is open is pressurized against the prepreg 30 to afford a single rigid-flexible PCB wherein the rigid regions interleaved with the prepreg 30 are connected to each other via the flexible region which is partially covered by the polyimide coverlay.

Construction of a multilayer PCB can be achieved by bonding a single rigid-flexible PCB to another interleaved with a prepreg 30' positioned at the axis of mirror symmetry, with the aid of a press. As seen in FIG. 1, the multilayer PCB has rigid regions which are supported by prepregs 30 and 30' to impart mechanical strength to the PCB, and flexible regions which are partially covered with polyimide film 20 and connect the rigid regions to each other.

Subsequently, etching and plating results in a via-hole for electrical interlayer connection while forming a predetermined outer circuit pattern, as shown in FIG. 3.

Next, a coverlay is formed of a polyimide film over a part of the outer circuit pattern which corresponds to the flexible region.

Afterward, the PCB is coated with a photoimageable solder resist mask ink 160 to protect the outer circuit pattern 150 as well as to prevent solder bridge formation across the outer circuit pattern 150. As a result, there is obtained a single or multi-layer rigid-flexible PCB in which coverlays made of a polyimide film are formed over the flexible region.

Such rigid-flexible PCBs, however, require a long manufacturing time and high production cost due to the coverlay processing and pseudo-bonding processes. In addition, the PCBs shows low reliability in circuit formation and stacking because of the steps caused by the partially deposited coverlay films.

To solve the problems, the overall portion of the flexible region is covered with a coverlay film, which is described with reference to FIG. 2.

First, while being masked, a copper foil layer 12 which, together with a polyimide layer 11, constitutes a polyimide copper foil laminate 10, is patterned to form a predetermined inner circuit pattern (not shown) thereon.

In order to protect the inner circuit pattern, a polyimide film 20 is bonded using an adhesive 21 onto the inner circuit pattern, covering the entire flexible region.

After the formation of the polyimide film colerlay 20 on the flexible region, a prepreg 30 is provided to give mechanical strength and bonding power to the polyimide copper foil laminate 10, as shown in FIG. 2.

Afterwards, another copper foil laminate 10', in which a polyimide layer is open, is pressurized against the prepreg 30 to afford a single rigid-flexible PCB wherein the rigid regions supported by the prepreg 30 are connected to each other via the flexible region which is fully covered by the polyimide coverlay.

Construction of a multilayer PCB can be achieved by bonding a single rigid-flexible PCB to another interleaved with a prepreg 30' positioned at the axis of mirror symmetry, with the aid of a press. As seen in FIG. 2, the multilayer PCB has rigid regions which are supported by prepregs 30 and 30' to impart mechanical strength to the PCB, and flexible regions which are fully covered with polyimide film 20 and interconnect the rigid regions to each other.

Subsequently, etching and plating results in a via-hole for electrical interlayer connection while forming a predetermined outer circuit pattern, as shown in FIG. 3.

Next, a coverlay is formed of a polyimide film over a part of the outer circuit pattern which corresponds to the flexible region.

Afterward, the PCB is coated with a photoimageable solder resist mask ink 160 to protect the outer circuit pattern 150 as well as to prevent solder bridge formation across the outer circuit pattern 150. As a result, there is obtained a single or multi-layer rigid-flexible PCB in which coverlays made of a polyimide film are formed over the flexible region.

When a coverlay made of the polyimide film is deposited over the entire flexible region, the fabrication of PCB can be simplified compared to the partial coating process described in FIG. 1 because the pseudo-bonding and coverlay processing can be omitted.

However, the face of the coverlay polyimide film 20, which is not coated with the adhesive 21, has such a low surface energy due to its characteristic stiff molecular structure as to weakly bond with the prepreg 30 and 30'. Accordingly, the coverlay is easily delaminated from the prepreg 30 and 30', which deteriorates product reliability. That is, when the polyimide film 20 for coverlay is bonded with the adhesive 21 to the flexible region, delamination between the polyimide film 20 and the adhesive 21 occurs because of the different coefficients of thermal expansion therebetween and the low thermal stability thereof.

Problems with the conventional processes also include poor dimensional stability in products and high dielectric constant in insulation layers because the polyimide film 20 has low surface energy and polar polyermic chains. Thus, it is difficult to achieve low power consumption, high frequency adoption, and slimness for conventional products.

Further, the high cost of the polyimide film impedes the price competitiveness of the conventional products.

SUMMARY OF THE INVENTION

Leading to the present invention, the intensive and thorough research on rigid-flexible PCBs, conducted by the present inventors, resulted in the finding that an all layer process employing liquid crystalline polymers can avoid interlayer delamination as well as achieving light, slim, short and small rigid-flexible PCBs.

It is an object of the present invention to provide a rigid-flexible PCB which shows low power consumption and high frequency availability as well as being highly reliable, inexpensive and slim.

It is another object of the present invention to provide a method for fabricating the rigid-flexible PCB.

According to one aspect of the present invention, there is provided a method for fabricating a rigid-flexible printed circuit board, comprising the steps of: providing a first base board including a liquid crystalline polymer one or both sides of which are covered with a copper foil layer; conducting an image processing process on the copper foil layer to form an inner circuit pattern; forming a coverlay with a liquid crystalline polymer over a portion of the inner circuit pattern which corresponds to a flexible region of the first base board; bonding the first base board to another first base board using an adhesive material in such a way that the liquid crystalline polymers of the resulting structure are interleaved with the adhesive material and face each other, said adhesive material being open at a portion corresponding to the flexible region; depositing a second base board, consisting of a copper foil layer and a liquid crystalline polymer layer, over each side of the bonded first base board structure in such a way that the liquid crystalline polymer layer of the second base board is positioned to face to the inner circuit pattern of the first base board, said liquid crystalline polymer being open at a portion corresponding to the flexible region; conducting image processing on the copper foil layer of the second base board to form an outer circuit pattern; forming a coverlay with a liquid crystalline polymer over a portion of the outer circuit pattern which corresponds to the flexible region; and coating the PCB with a photo imageable solder resist mask ink to form a solder mask for protecting the outer circuit pattern from a soldering process.

According to another aspect of the present invention, there is provided a rigid-flexible printed circuit board, comprising: a plurality of first base boards, each having a liquid crystalline polymer layer one or both sides of which are covered with a copper foil layer on which an inner circuit pattern is formed; a plurality of first coverlays, each deposited over a portion of the inner circuit pattern which corresponds to a flexible region; a plurality of adhesives through which the first base boards are bonded to each other in such a way that the crystalline liquid polymers face each other; a plurality of second base boards, each having an outer circuit pattern and being deposited over the first base board using an adhesive material; a plurality of second coverlays, each deposited over a portion of the outer circuit pattern, covering the flexible region of the second base board; and a plurality of solder masks for protecting the outer circuit pattern.

DETAILED DESCRIPTION OF THE INVENTION

An all-layer processing process for the fabrication of rigid-flexible PCBs according to the present invention will be described in detail with reference to the accompanying drawings.

Figure 1:
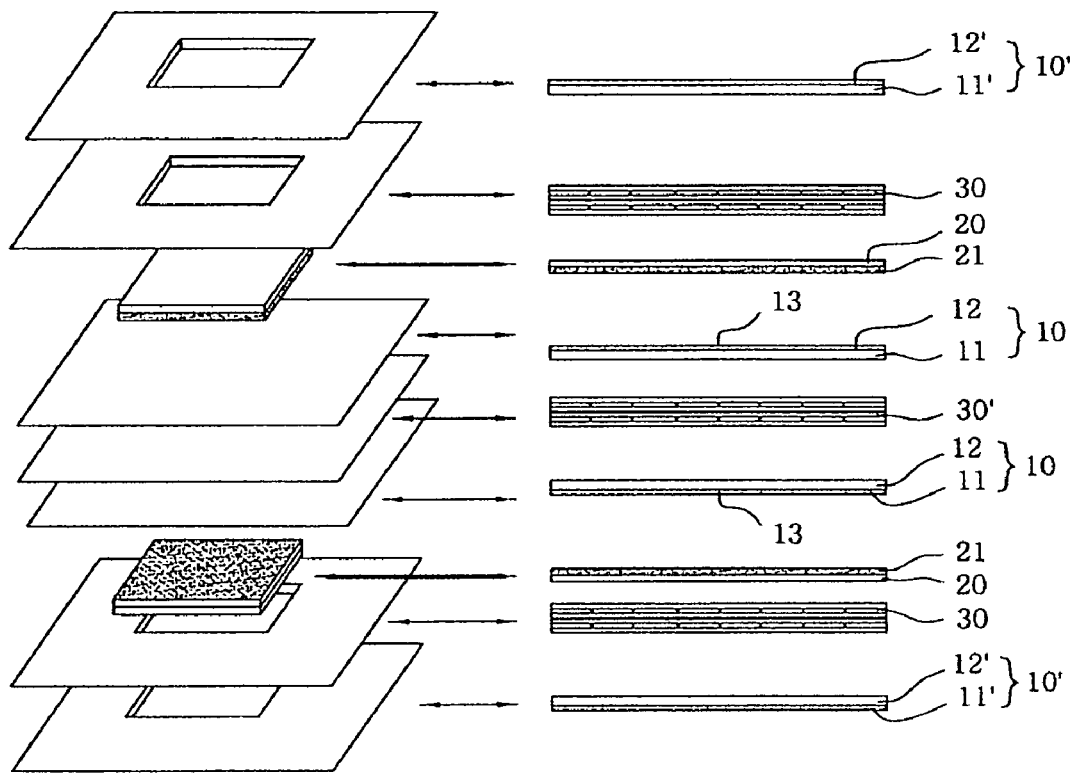
FIG. 1 illustrates the position of a flexible region in a rigid-flexible PCB fabricated according to a conventional partial coating process using a polyimide film.
Figure 2:
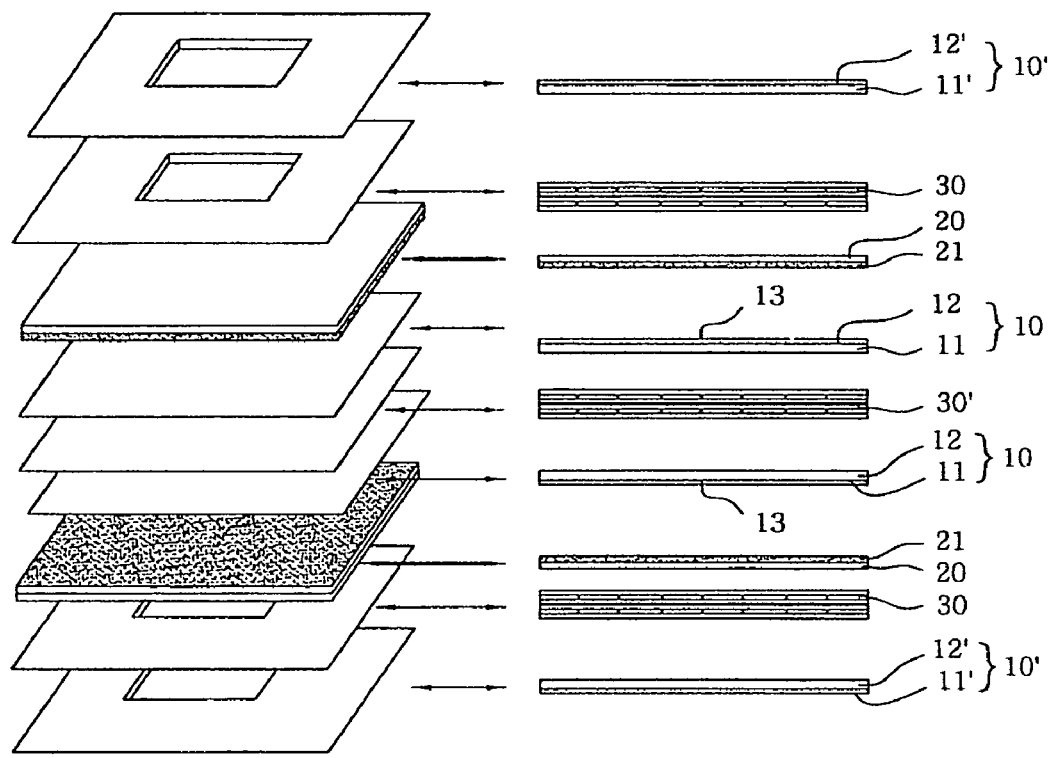
FIG. 2 illustrates the position of a flexible region in a rigid-flexible PCB fabricated according to a conventional full coating process using a polyimide film.
Figure 3:
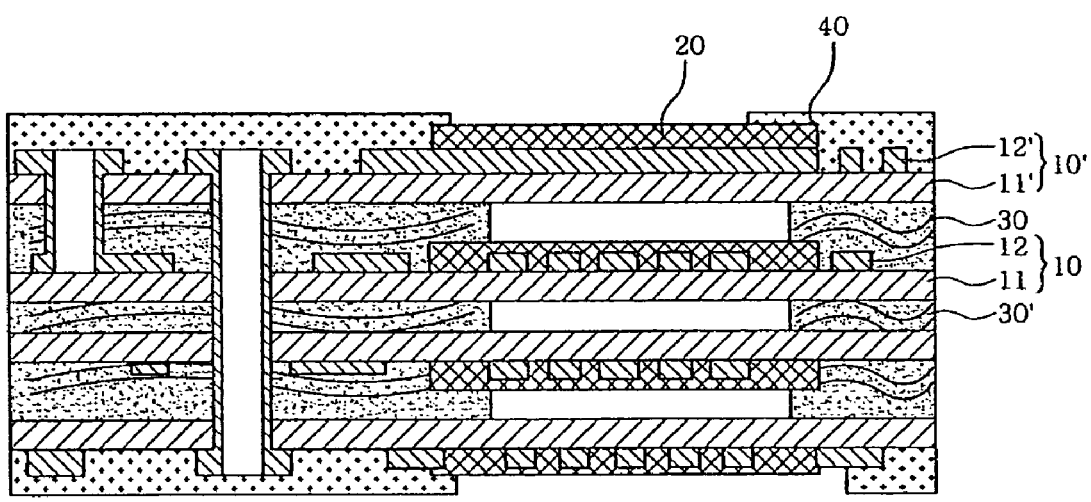
FIG. 3 is a cross sectional view of a rigid-flexible PCB according to the conventional process.
Figure 4:
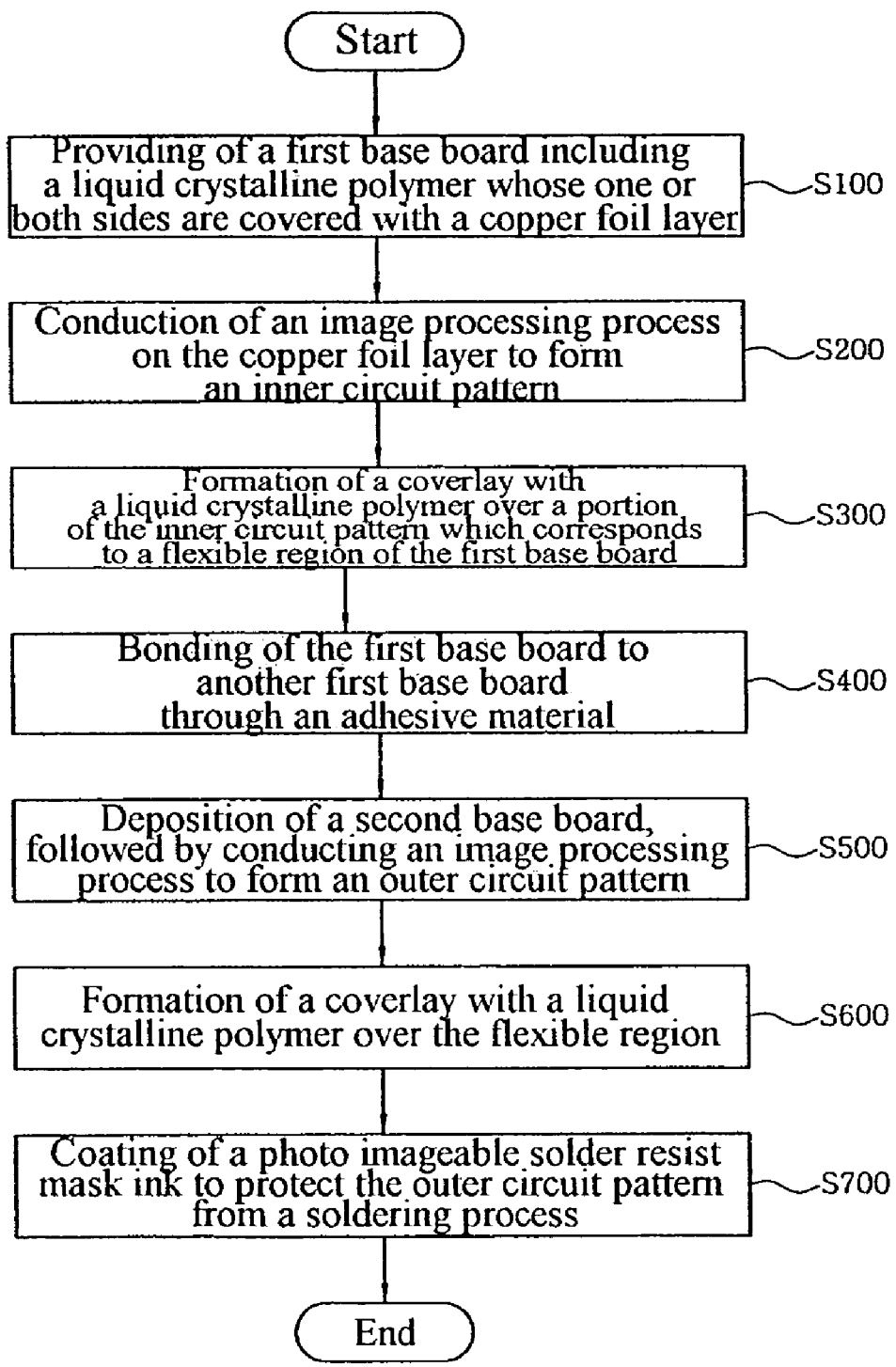
FIG. 4 is a flow chart showing the all-layer processing for fabricating a rigid-flexible PCB according to the present invention.

With reference to FIGS. 4 and 5, there are a flow chart and cross sectional views illustrating the fabrication of a rigid-flexible PCB according to the present invention.

Provided first is a liquid crystalline polymer copper foil laminate 100 which will act as a first base board for the rigid-flexible PCB (S100). The liquid crystalline polymer copper foil laminate 100 comprises a liquid crystalline polymer layer 110 one or both sides of which are covered with a copper foil layer 120.

Figure 5A:
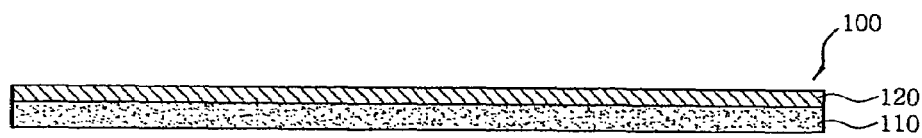
FIG. 5 provides cross sectional views showing the fabrication of a rigid-flexible PCB according to the present invention.

For convenience, the description will continue using as an example a liquid crystalline polymer copper foil laminate 100 which has a copper foil layer 120 formed on one side of the liquid crystalline polymer layer 110, as shown in FIG. 5a. However, it should be understood that a liquid crystalline polymer copper foil laminate having two copper foil layers interleaved with a liquid crystalline polymer layer therebetween also falls into the spirit and scope of the present invention.

Then, image processing is conducted on the copper foil layer 120 of the first base board 100 (S200).

Figure 5B:
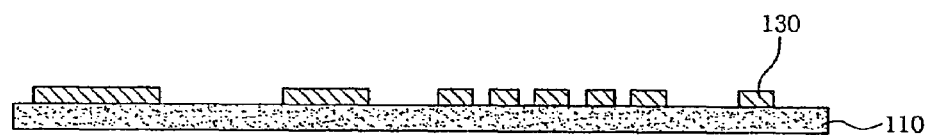

In more detail, a photosensitive dry film is thermally pressurized against the copper foil layer 120 by use of a hot roller, followed by the close adherence of an artwork film having a predetermined inner circuit pattern to the photosensitive dry film. Subsequently, when exposed to UV light through the patterned artwork film, the photosensitive dry film is cured. Treatment with a developing solution such as sodium carbonate or potassium carbonate dissolves the uncured region of the photosensitive dry film to make the copper foil layer 120 of the liquid crystalline polymer copper foil laminate 100 open. With the remaining cured photosensitive film pattern serving as a mask, the open copper foil layer 120 is etched to form a predetermined inner circuit pattern 130, as shown in FIG. 5b.

Afterwards, a coverlay 200 is provided for protecting from the external environment a part of the inner circuit pattern 130' at which a flexible region will be formed (S300).

Figure 5C:

The coverlay 200 is formed of the same material used in the liquid crystalline polymer layer 110 of the first base board 100. In this regard, the liquid crystalline polymer is deposited at 230-300° C. for 20-120 min under a pressure of 10-60 kgf/cm$^2$ over all or part of the flexible region, as seen in FIG. 5c.

Using a liquid crystalline polymer which can be molded at the above temperature (e.g., 240° C.), the coverlay 200 may be formed in a single layer or a multi-layered structure. In the latter case, an adhesive may be used to bond the coverlay layers. Exemplified by epoxy or acryl, adhesives suitable for use in the formation of such a multiple layer structure have a melting point similar to the molding temperature (e.g., 240° C.). When the coverlay 200 is constructed in a multilayer structure, to prevent the interlayer conjunction of the flexible regions upon subsequent molding processes, materials for the coverlay and the adhesive may be liquid polymers if the coverlay material has a higher melting point (e.g., 275° C.) than that of the adhesive material (e.g., 240° C.).

In addition, the coverlay 200 interleaved with an epoxy or acrylic adhesive may be formed at a slightly lower temperature, e.g., 120-150° C. for 20-120 min, over all or part of the flexible region.

Figure 5D:
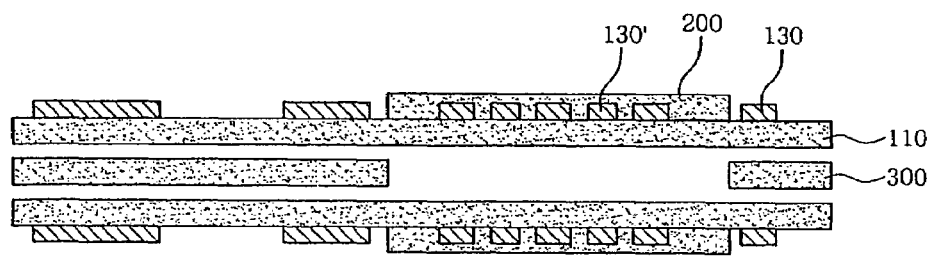

Following the formation of the coverlay 200 over the flexible region, the resulting structure is bonded to another resulting structure through an adhesive material 300, in such a way that the base boards 110 of the two structures face each other (S400). The adhesive material 300 is open at a position corresponding to the flexible region of the base board 110, as seen in FIG. 5d. The adhesive material 300 is preferably a liquid polymer which shows a strong adhesive strength when pressurized at a predetermined temperature. Also, the adhesive material 300 imparts mechanical strength to the resulting rigid-flexible PCB.

Both the top and bottom sides of the resulting structure consisting of two of the first base boards 100 interleaved with the adhesive material 300, are covered with a second base board 100', followed by conducting image processing to form an outer circuit pattern (S500).

Figure 5E:
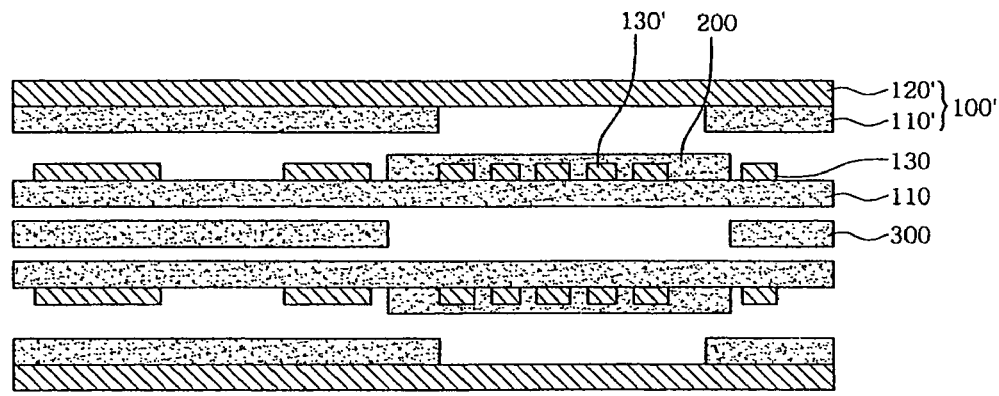

In detail, a second base board 100', in which an outer circuit pattern will be formed, is stacked on each of the first base boards which are bonded using the adhesive material 300, facing each other, as seen in FIG. 5e. The second base board 100' comprises a liquid crystalline polymer 110' which is open at a portion corresponding to the flexible region of the first base board. One or both sides of the second base board are covered with a copper foil layer 120'. Upon stacking the second base board 100' onto the first base board 100, the liquid crystalline polymer 110' of the second base board 100' is positioned to face to the inner circuit pattern 130 of the first base board 100.

Figure 5F:
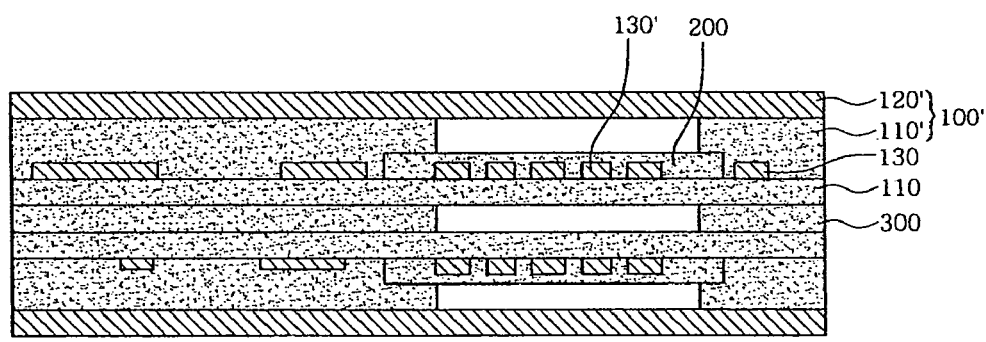

Pressing the stacked resulting structure including the first base boards 100 and the second base boards 100' forms a single- or multi-layer rigid-flexible PCB in which a rigid region supported by the adhesive material 300 imparts a mechanical strength and a flexible region covered with the coverlay 200 connects the rigid region, as seen in FIG. 5f.

Figure 5G:
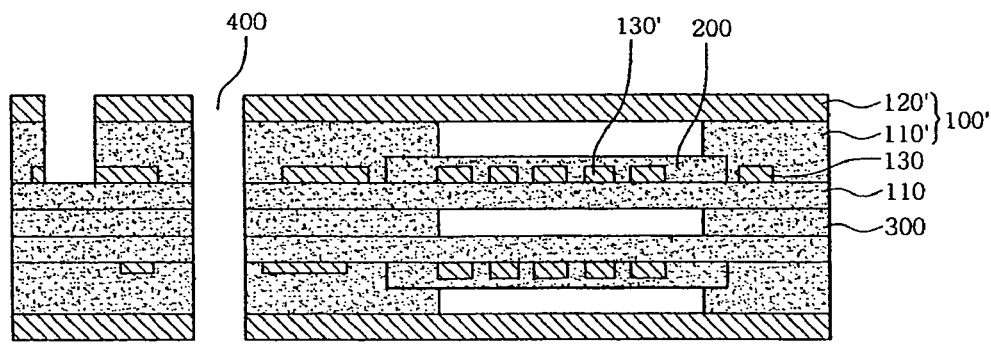

Subsequently, a via-hole 400 is formed through which the layers of the rigid-flexible PCB are electrically interconnected, as seen in FIG. 5g. The formation of the via-hole 400 is conducted at a spindle speed of 70,000-120,000, at a feed speed of 1.5-3.0 m/min at a retract rate of 11-13 m/min. Lower in thermal expansion than polyimide resin, the liquid crystalline polymer shows excellent laser drill processability. Preferably, laser drilling is conducted in a short time and many times in order to prevent deterioration of the sidewall of the via-hole formed.

Figure 5H:
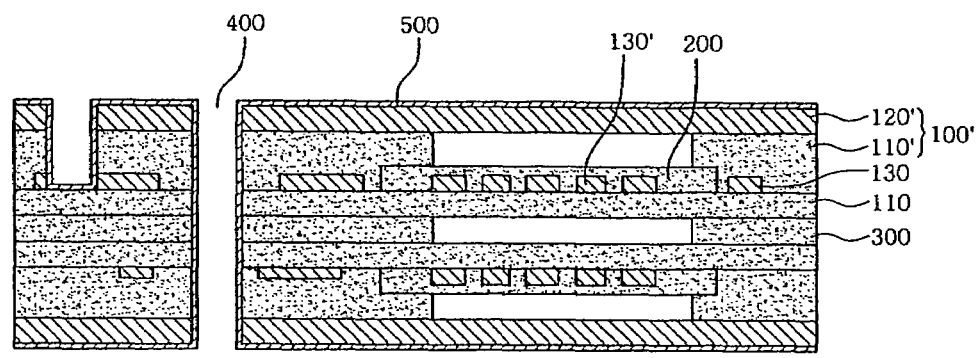

Next, plating is conducted over the resulting structure including the via-hole 400 to give form a plate layer 500 which will be provided for the formation of an outer circuit pattern as seen in FIG. 5h.

Figure 5I:
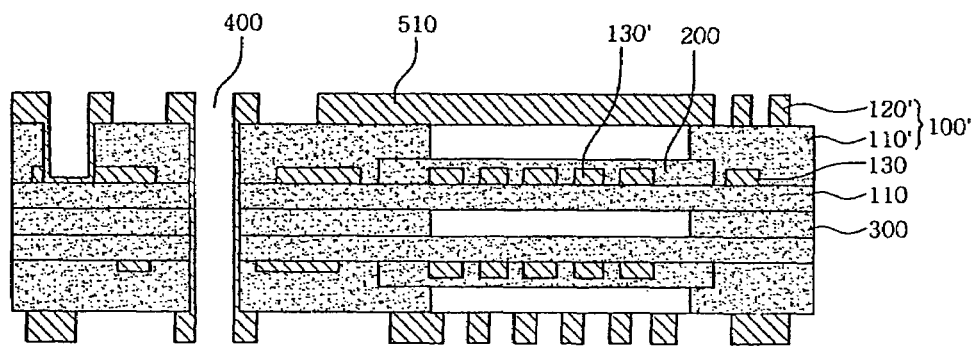

After a masking process on the plate layer 500, a predetermined outer circuit pattern 510 is formed, as shown in FIG. 5i. A detailed description of the formation of the outer circuit pattern 510 is omitted because its procedure is the same as described with reference to FIG. 5b.

Using the liquid crystalline polymer as described above, a coverlay 200' is formed over a portion of the outer circuit pattern 510 which corresponds to the flexible region (S600).

Figure 5J:
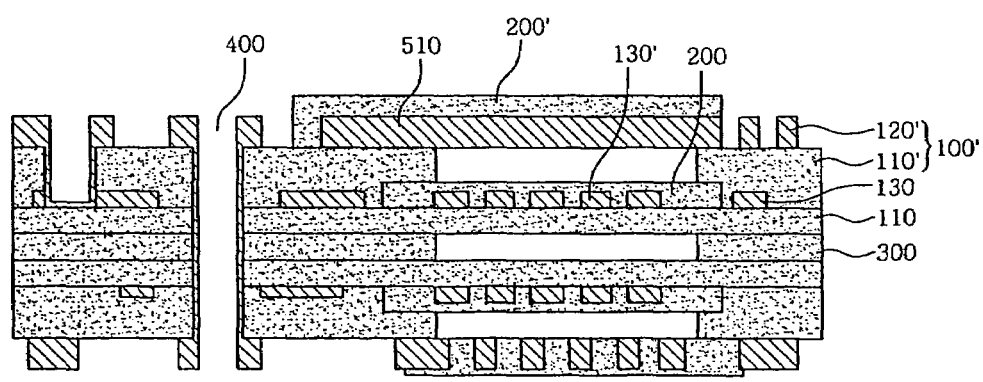

At 230-300° C. for 20-120 min under a pressure of 10-60 kgf/cm$^2$, the liquid crystalline polymer for the formation of the coverlay 200' is deposited over all or part of the flexible region, as shown in FIG. 5j.

Using a liquid polymer which can be molded at the above temperature (e.g., 240° C.), the coverlay 200' may be formed in a single layer or a multi-layer structure. In the latter case, an adhesive may be used to bond the coverlay layers. Exemplified by epoxy or acryl (not shown), adhesives suitable for use in the formation of such a multiple coverlay structure have a melting point similar to the molding temperature (e.g., 240° C.). When the coverlay 200' is constructed in a multilayer structure, to prevent the interlayer conjunction of the flexible regions upon subsequent molding processes, materials for the coverlay and the adhesive may be liquid polymers if the coverlay material has a higher melting point (e.g., 275° C.) than that of the adhesive material (e.g., 240° C.).

Alternatively, the coverlay 200' interleaved with an epoxy or acrylic adhesive may be formed at a slightly lower temperature, e.g., 120-150° C. for 20-120 min, over all or part of the flexible region.

Finally, a photo imageable solder resist mask ink 600 is selectively applied to the resulting structure to protect the outer circuit pattern 510 from a soldering process (S700). In this regard, the photo imageable solder resist mask ink 600 protects the outer circuit pattern 610 as well as serving to prevent a solder bridge across the outer circuit pattern 610 during a soldering process.

Figure 5K:
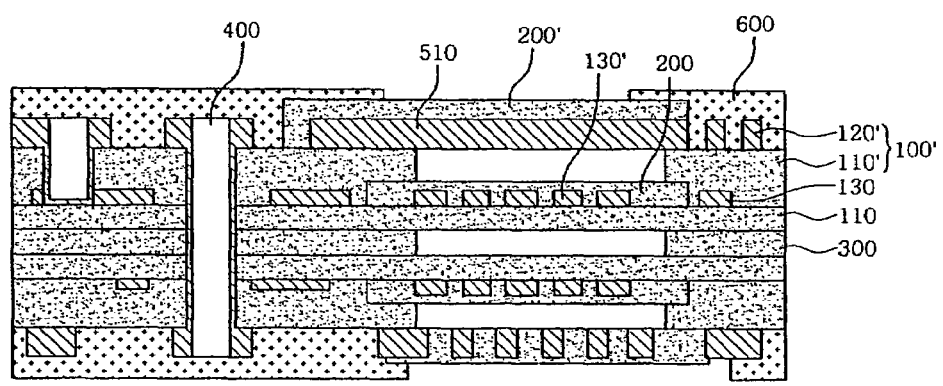
Figure 5L:
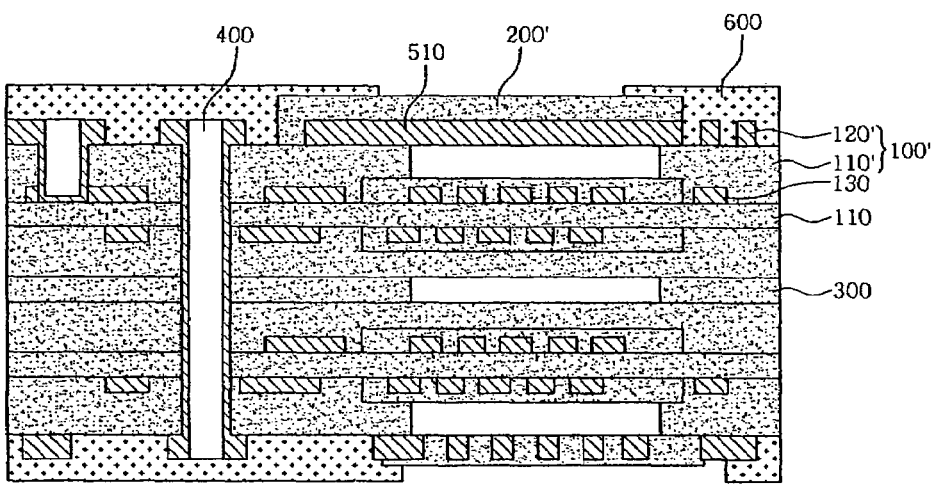

FIGS. 5k and 5l show structures of the rigid-flexible PCBs fabricated according to the all-layer process of the present invention, which employ a base board 100 having a copper foil layer deposited over one face of a liquid crystalline polymer and a base board 100 having two copper foil layers interleaved with a liquid crystalline polymer, respectively.

Characterized by using a liquid crystalline polymer for the formation of coverlay over flexible regions, the all-layer processing method according to the present invention has the advantage of preventing interlayer delamination, thus providing a highly reliable rigid-flexible PCB.

Also, the rigid-flexible PCB fabricated according to the all-layer processing of the present invention meets the recent requirements of electric appliances for low energy consumption, high frequency adoption, and slimness.

Additionally, the use of liquid crystalline polymers reduces the production cost because the polymers are inexpensive.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

The invention claimed is:

1. A rigid-flexible printed circuit board, comprising:
   a plurality of first base boards, each having a liquid crystalline polymer layer one or both sides of which are covered with a copper foil layer on which an inner circuit pattern is formed;
   a plurality of first coverlays, each deposited over a portion of the inner circuit pattern which corresponds to a flexible region;
   a plurality of adhesives through which the first base boards are bonded to each other in such a way that the crystalline liquid polymers face each other;
   a plurality of second base boards, each having an outer circuit pattern and being deposited over the first base board through an adhesive material;
   a plurality of second coverlays, each deposited over a portion of the outer circuit pattern, covering the flexible region of the second base board; and
   a plurality of solder masks for protecting the outer circuit pattern.

2. The rigid-flexible printed circuit board as set forth in claim 1, wherein the first and the second coverlays are deposited in a multi-layer structure with the use of an adhesive by pressing a liquid crystalline polymer at a predetermined molding temperature against a portion of the inner and the outer circuit patterns which correspond to the flexible region.

3. The rigid-flexible printed circuit board as set forth in claim 2, wherein the adhesive is selected from among a liquid crystalline polymer, an epoxy resin and an acryl resin.

4. The rigid-flexible printed circuit board as set forth in claim 2, wherein the first and the second coverlays are respectively deposited over the inner and the outer circuit patterns, overlapping the flexible region.

5. The rigid-flexible printed circuit board as set forth in claim 2, wherein the first and the second coverlays are respectively deposited over the inner and the outer circuit patterns, fully covering the flexible region.

6. The rigid-flexible printed circuit board as set forth in claim 1, wherein the adhesive for bonding the first base boards to each other is a liquid crystalline polymer.

* * * * *